US012672586B2

(12) United States Patent
Sahoo

(10) Patent No.: US 12,672,586 B2
(45) Date of Patent: Jun. 30, 2026

(54) MICROELECTRONIC DEVICE PACKAGES INCLUDING WIREBONDING AND RELATED METHODS, MEMORY DEVICES, AND ELECTRONIC SYSTEMS

(71) Applicant: Micron Technology, Inc., Boise, ID (US)

(72) Inventor: Akanksha Sahoo, Hyderabad (IN)

(73) Assignee: Micron Technology, Inc., Boise, ID (US)

( * ) Notice: Subject to any disclaimer, the term of this patent is extended or adjusted under 35 U.S.C. 154(b) by 618 days.

(21) Appl. No.: 18/054,103

(22) Filed: Nov. 9, 2022

(65) Prior Publication Data

US 2024/0153914 A1 May 9, 2024

(51) Int. Cl.
H01L 25/065 (2023.01)
H10W 70/68 (2026.01)
H10W 90/00 (2026.01)
*H10W 90/20* (2026.01)
*H10W 90/24* (2026.01)

(52) U.S. Cl.
CPC ........... H10W 90/00 (2026.01); H10W 70/68 (2026.01); *H10W 90/24* (2026.01); *H10W 90/288* (2026.01); *H10W 90/754* (2026.01)

(58) Field of Classification Search
CPC ..... H01L 25/0657; H01L 23/13; H01L 25/50; H01L 2225/0651
See application file for complete search history.

(56) References Cited

U.S. PATENT DOCUMENTS

| | | | |
|---|---|---|---|
| 4,963,414 A | 10/1990 | LeVasseur et al. | |
| 5,198,885 A | 3/1993 | Ibrahim | |
| 6,645,606 B2 | 11/2003 | Nakano et al. | |
| 6,843,421 B2 * | 1/2005 | Chhor .............. | G06K 19/07743 |
| | | | 257/679 |
| 2019/0214369 A1 * | 7/2019 | Seidemann ........... | H10W 90/00 |
| 2021/0066155 A1 * | 3/2021 | Nofen .................. | H10W 40/25 |
| 2021/0125958 A1 * | 4/2021 | Yang .................... | H05K 1/0203 |
| 2022/0028832 A1 * | 1/2022 | Lin ........................ | H10W 90/00 |
| 2022/0028850 A1 * | 1/2022 | Arifeen ................. | H10W 90/00 |
| 2023/0343749 A1 * | 10/2023 | Mao ........................ | H01L 24/19 |
| 2024/0072022 A1 * | 2/2024 | Ye ........................... | H01L 25/18 |
| 2024/0113033 A1 * | 4/2024 | Goh .................... | H10W 70/614 |
| 2024/0234390 A1 * | 7/2024 | Ye ......................... | H10W 90/00 |
| 2024/0234403 A1 * | 7/2024 | Ye ........................... | H01L 25/50 |

OTHER PUBLICATIONS

Gupta et al., Ultra-Thin Chips for High-Performance Flexible Electronics, Nature Partner Journals Flexible Electronics, (2018)2:8; doi:10.1038/s41528-018-0021-5; 17 pages.
Zeng et al., High Thermal Conductive Epoxy Molding Compound with Thermal Conductive Pathway, Journal of Applied Polymer Science, vol. 113, (2009), pp. 2117-2125.

* cited by examiner

*Primary Examiner* — Thao P Le
(74) *Attorney, Agent, or Firm* — TraskBritt

(57) ABSTRACT
A memory device may include a carrier including a connection region and a routing region positioned at an angle relative to the connection region. The memory device may further include a wire bond coupled between at least one microelectronic device and the routing region of the carrier. The memory device may also include a support structure positioned adjacent the routing region on a side of the routing region opposite the at least one microelectronic device.

22 Claims, 7 Drawing Sheets

MICROELECTRONIC DEVICE PACKAGES INCLUDING WIREBONDING AND RELATED METHODS, MEMORY DEVICES, AND ELECTRONIC SYSTEMS

TECHNICAL FIELD

Embodiments of the disclosure generally relate to stacked die packages. In particular, embodiments of the disclosure relate to stacked die packages including wire bonding and associated methods, devices, and systems.

BACKGROUND

As a consequence of many factors, including demand for increased portability, computing power, memory capacity and energy efficiency, microelectronic devices such as semiconductor devices and packages comprising such devices, are continuously being reduced in size. The sizes (i.e., critical dimensions) of the constituent features that form the devices, e.g., circuit elements and interconnect lines, as well as the pitch between (i.e., spacing) structures are also constantly being decreased to facilitate this size reduction.

Semiconductor devices may be stacked, such as, in stacked semiconductor packages (e.g., 3-D integrated circuits) to increase one or more of a capacity, computing power, etc., of the resulting semiconductor device while still consuming less real estate (i.e., surface area) and facilitating signal speed and integrity. Stacked semiconductor packages include a plurality of vertically stacked semiconductor dice. The semiconductor dice, in a stacked semiconductor die package, may be operably coupled together by through-silicon vias (TSVs), direct contacts, or wire bonding.

BRIEF DESCRIPTION OF THE DRAWINGS

While the specification concludes with claims particularly pointing out and distinctly claiming embodiments of the disclosure, the advantages of embodiments of the disclosure may be more readily ascertained from the following description of embodiments of the disclosure when read in conjunction with the accompanying drawings in which:

DETAILED DESCRIPTION

Figure 1:
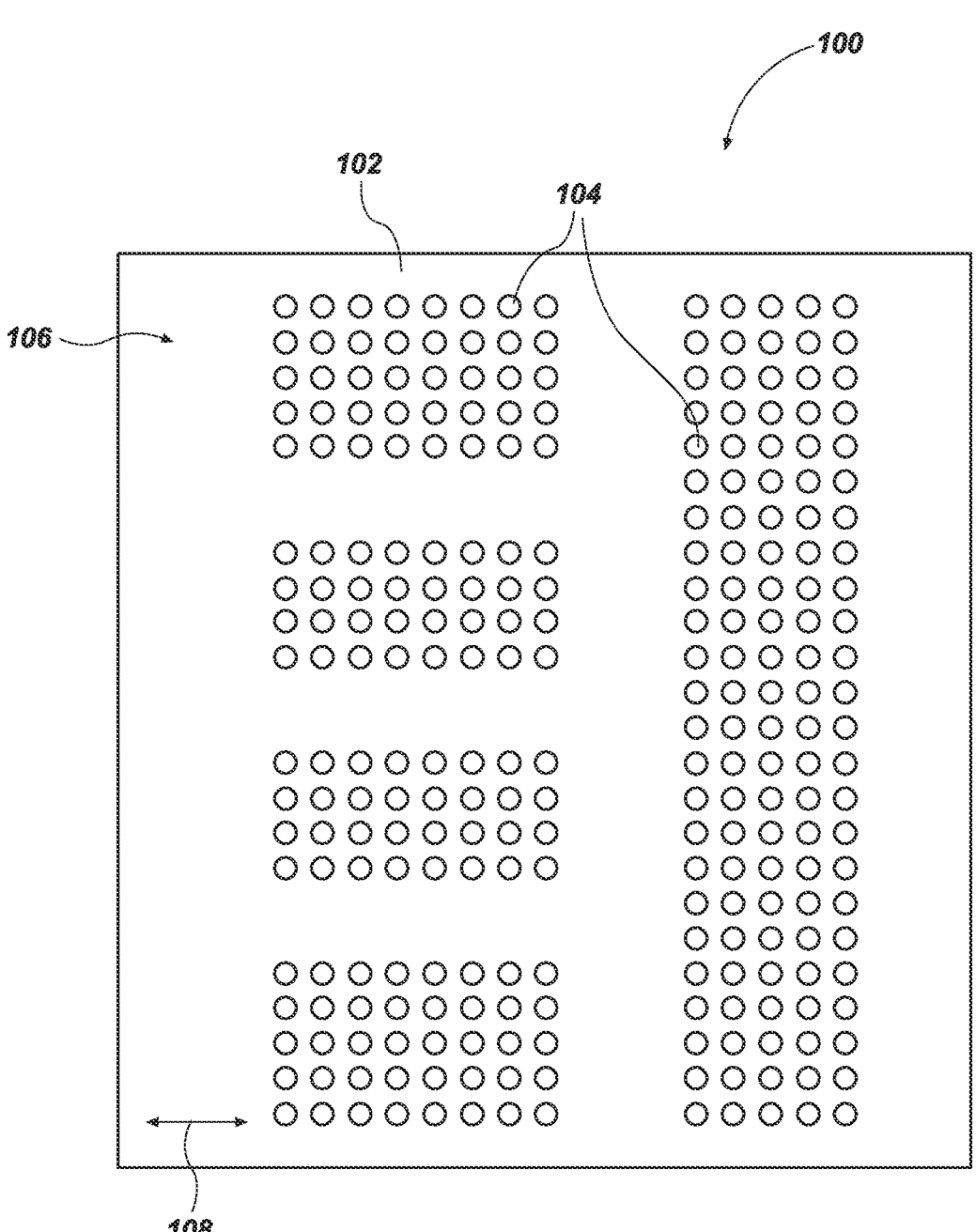
FIG. 1 illustrates a top down view of a carrier in accordance with embodiments of the disclosure.

The following description provides specific details, such as material compositions, shapes, and sizes, in order to provide a thorough description of embodiments of the disclosure. However, a person of ordinary skill in the art would understand that the embodiments of the disclosure may be practiced without employing these specific details. Indeed, the embodiments of the disclosure may be practiced in conjunction with conventional microelectronic device fabrication techniques employed in the industry. In addition, the description provided below does not form a complete process flow for manufacturing a microelectronic device (e.g., a memory device). The structures described below do not form a complete microelectronic device. Only those process acts and structures necessary to understand the embodiments of the disclosure are described in detail below. Additional acts to form a complete microelectronic device from the structures may be performed by conventional fabrication techniques.

Drawings presented herein are for illustrative purposes only, and are not meant to be actual views of any particular material, component, structure, device, or system. Variations from the shapes depicted in the drawings as a result, for example, of manufacturing techniques and/or tolerances, are to be expected. Thus, embodiments described herein are not to be construed as being limited to the particular shapes or regions as illustrated, but include deviations in shapes that result, for example, from manufacturing. For example, a region illustrated or described as box-shaped may have rough and/or nonlinear features, and a region illustrated or described as round may include some rough and/or linear features. Moreover, sharp angles that are illustrated may be rounded, and vice versa. Thus, the regions illustrated in the figures are schematic in nature, and their shapes are not intended to illustrate the precise shape of a region and do not limit the scope of the present claims. The drawings are not necessarily to scale. Additionally, elements common between figures may retain the same numerical designation.

As used herein, a "memory device" means and includes microelectronic devices exhibiting memory functionality, but not necessarily limited to memory functionality. Stated another way, and by way of non-limiting example only, the term "memory device" includes not only conventional memory (e.g., conventional non-volatile memory; conventional volatile memory), but also includes an application specific integrated circuit (ASIC) (e.g., a system on a chip (SoC)), a microelectronic device combining logic and memory, and a graphics processing unit (GPU) incorporating memory.

As used herein, the terms "configured" and "configuration" refers to a size, a shape, a material composition, a material distribution, orientation, and arrangement of at least one feature (e.g., one or more of at least one structure, at least one material, at least one region, at least one device) facilitating use of the at least one feature in a pre-determined way.

As used herein, the term "substantially" in reference to a given parameter means and includes to a degree that one skilled in the art would understand that the given parameter, property, or condition is met with a small degree of variance, such as within acceptable manufacturing tolerances. By way of example, depending on the particular parameter, property, or condition that is substantially met, the parameter, property, or condition may be at least 90.0 percent met, at least 95.0 percent met, at least 99.0 percent met, at least 99.9 percent met, or even 100.0 percent met.

As used herein, "about" or "approximately" in reference to a numerical value for a particular parameter is inclusive of the numerical value and a degree of variance from the numerical value that one of ordinary skill in the art would understand is within acceptable tolerances for the particular parameter. For example, "about" or "approximately" in reference to a numerical value may include additional numerical values within a range of from 90.0 percent to 110.0 percent of the numerical value, such as within a range of from 95.0 percent to 105.0 percent of the numerical value, within a range of from 97.5 percent to 102.5 percent of the numerical value, within a range of from 99.0 percent to 101.0 percent of the numerical value, within a range of from 99.5 percent to 100.5 percent of the numerical value, or within a range of from 99.9 percent to 100.1 percent of the numerical value.

As used herein, relational terms, such as "beneath," "below," "lower," "bottom," "above," "upper," "top," "front," "rear," "left," "right," and the like, may be used for ease of description to describe one element's or feature's relationship to another element(s) or feature(s) as illustrated in the drawings. Unless otherwise specified, the spatially relative terms are intended to encompass different orientations of the materials in addition to the orientation depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (e.g., rotated 90 degrees, inverted, flipped) and the spatially relative descriptors used herein interpreted accordingly.

As used herein, the singular forms "a," "an," and "the" are intended to include the plural forms as well, unless the context clearly indicates otherwise.

As used herein, the term "and/or" means and includes any and all combinations of one or more of the associated listed items.

As used herein, the terms "vertical," "longitudinal," "horizontal," and "lateral" are in reference to a major plane of a structure and are not necessarily defined by earth's gravitational field. A "horizontal" or "lateral" direction is a direction that is substantially parallel to the major plane of the structure, while a "vertical" or "longitudinal" direction is a direction that is substantially perpendicular to the major plane of the structure. The major plane of the structure is defined by a surface of the structure having a relatively large area compared to other surfaces of the structure. With reference to the drawings, a "horizontal" or "lateral" direction may be perpendicular to an indicated "Z" axis, and may be parallel to an indicated "X" axis and/or parallel to an indicated "Y" axis; and a "vertical" or "longitudinal" direction may be parallel to an indicated "Z" axis, may be perpendicular to an indicated "X" axis, and may be perpendicular to an indicated "Y" axis.

As used herein, "conductive material" means and includes electrically conductive material such as one or more of a metal (e.g., tungsten (W), titanium (Ti), molybdenum (Mo), niobium (Nb), vanadium (V), hafnium (Hf), tantalum (Ta), chromium (Cr), zirconium (Zr), iron (Fe), ruthenium (Ru), osmium (Os), cobalt (Co), rhodium (Rh), iridium (Jr), nickel (Ni), palladium (Pd), platinum (Pt), copper (Cu), silver (Ag), gold (Au), aluminum (Al)), an alloy (e.g., a Co-based alloy, an Fe-based alloy, an Ni-based alloy, an Fe- and Ni-based alloy, a Co- and Ni-based alloy, an Fe- and Co-based alloy, a Co- and Ni- and Fe-based alloy, an Al-based alloy, a Cu-based alloy, a magnesium (Mg)-based alloy, a Ti-based alloy, a steel, a low-carbon steel, a stainless steel), a conductive metal-containing material (e.g., a conductive metal nitride, a conductive metal silicide, a conductive metal carbide, a conductive metal oxide), and a conductively-doped semiconductor material (e.g., conductively-doped polysilicon, conductively-doped germanium (Ge), conductively-doped silicon germanium (SiGe)). In addition, a "conductive structure" means and includes a structure formed of and including conductive material.

As used herein, "insulative material" means and includes electrically insulative material, such one or more of at least one dielectric oxide material (e.g., one or more of a silicon oxide ($SiO_x$), phosphosilicate glass, borosilicate glass, borophosphosilicate glass, fluorosilicate glass, an aluminum oxide ($AlO_x$), a hafnium oxide ($HfO_x$), a niobium oxide ($Nba_{-x}$), a titanium oxide ($TiO_x$), a zirconium oxide ($ZrO_x$), a tantalum oxide ($TaO_x$), and a magnesium oxide ($MgO_x$)), at least one dielectric nitride material (e.g., a silicon nitride ($SiN_y$)), at least one dielectric oxynitride material (e.g., a silicon oxynitride ($SiO_xN_y$)), at least one dielectric oxycarbide material (e.g., silicon oxycarbide ($SiO_xC_y$)), at least one hydrogenated dielectric oxycarbide material (e.g., hydrogenated silicon oxycarbide ($SiC_xO_yH_z$)), and at least one dielectric carboxynitride material (e.g., a silicon carboxynitride ($SiO_xC_zN_y$)). Formulae including one or more of "x," "y," and "z" herein (e.g., $SiO_x$, $AlO_x$, $HfO_x$, $Nba_{-x}$, $TiO_x$, $SiN_y$, $SiO_xN_y$, $SiO_xC_y$, $SiC_xO_yH_z$, $SiO_xC_zN_y$) represent a material that contains an average ratio of "x" atoms of one element, "y" atoms of another element, and "z" atoms of an additional element (if any) for every one atom of another element (e.g., Si, Al, Hf, Nb, Ti). As the formulae are representative of relative atomic ratios and not strict chemical structure, an insulative material may comprise one or more stoichiometric compounds and/or one or more non-stoichiometric compounds, and values of "x," "y," and "z" (if any) may be integers or may be non-integers. As used herein, the term "non-stoichiometric compound" means and includes a chemical compound with an elemental composition that cannot be represented by a ratio of well-defined natural numbers and is in violation of the law of definite proportions. In addition, an "insulative structure" means and includes a structure formed of and including insulative material.

FIG. 1 illustrates a top-down view of a carrier 100. The carrier 100 may be configured to receive one or more semiconductor devices to form a semiconductor package. The carrier 100 includes a substrate 102 configured to provide structural support to the resulting semiconductor package. The substrate 102 may include one or more material structures which may include conductive materials, insulative materials, or mixed material structures including both conductive materials and insulative materials. For example, at least a portion of the substrate 102 may include a printed circuit board (PCB) including conductive vias and paths disposed in material structures of insulative material and/or conductive material segmented and/or separated by insulative materials.

A top surface of the substrate 102 may include multiple connections 104 configured to electrically couple a semiconductor device to one or more elements of the substrate

102 of the carrier 100. The connections 104 may be conductive structures, such as solder balls, conductive pads, conductive pins, etc. The connections 104 may be arranged in patterns that may vary for different semiconductor packages. The patterns of the connections 104 may be configured to be substantially the same as corresponding patterns of connections on a semiconductor device.

The carrier 100 may include a routing region 106 substantially free from connections 104. A semiconductor device mounted to the carrier 100 may not be mounted over the routing region 106, such that the routing region 106 may remain accessible for processing after the semiconductor package is formed. For example, the associated semiconductor device(s) may be operatively coupled to the routing region 106 through wire bonds. In some embodiments, multiple semiconductor devices may be operatively coupled to one another through the routing region 106. For example, the routing region 106 may include a conductive material and connections of multiple different semiconductor devices to the conductive material may operatively couple the multiple different semiconductor devices through the conductive material of the routing region 106.

The routing region 106 may have a width 108 that accounts for between about 1/14 (7%) of a total width of the substrate 102 and about 1/10 (10%) of the total width of the substrate 102, such as about 1/12 (8%) of the total width of the substrate 102. For example, the routing region 106 may have a width in the range from about 1 mm to about 1.5 mm, such as from about 1 mm to about 1.3 mm, or about 1.1 mm.

As described in further detail below, the routing region 106 may be folded or bent up. Bending or folding up the routing region 106 may reduce a footprint of the carrier 100 by substantially the same area as the routing region 106.

Figure 2:
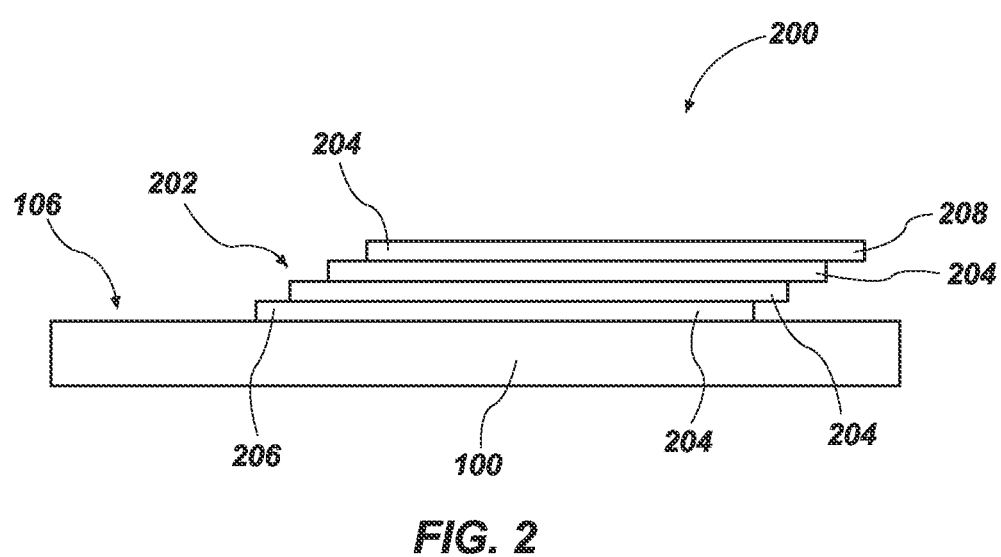
FIG. 2 illustrates a schematic view of a conventional microelectronic device package.

FIG. 2 illustrates a diagrammatic side view of a conventional microelectronic device package 200. The microelectronic device package 200 may include multiple microelectronic devices 204 arranged in a stack 202 over the carrier 100. One or more of the microelectronic devices 204 may be coupled to the carrier 100 through the connections 104 (FIG. 1). For example, a bottom microelectronic device 206 may include complementary or matching features to the connections 104, such as solder bumps, landing pads, pins, apertures, direct chip attachment features, etc. In some embodiments, the bottom microelectronic device 206 may include vias extending through the bottom microelectronic device 206 and configured to form a connection between the microelectronic devices 204 positioned over the bottom microelectronic device 206 and the connections 104.

The routing region 106 may remain substantially free from microelectronic devices 204. The routing region 106 increases a surface area of the carrier 100, which contributes to the total area in an associated electronic device. As described above, the routing region 106 may be configured to receive wire bonds from the microelectronic devices 204 in the stack 202 and may provide routing for the microelectronic devices 204. As the number of microelectronic devices 204 in the stack 202 increases, the length of a wire bond between the routing region 106 and a top microelectronic device 208 may increase.

Figure 3:
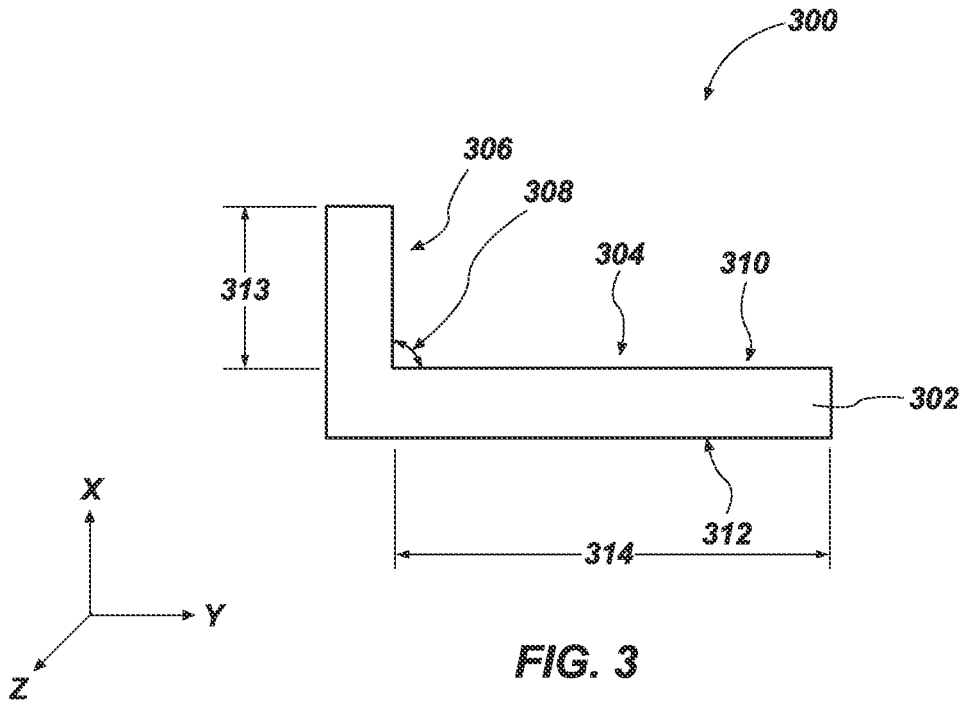
FIG. 3 illustrates a schematic view of a carrier during a processing act in accordance with embodiments of the disclosure.

FIGS. 3 through 6 illustrate diagrammatic side views of a microelectronic device during different processing stages. FIG. 3 illustrates a carrier 300. The carrier 300 may include one or more material structures of conductive materials and insulative materials. The conductive material may be a malleable material having a low elasticity, such that the material may be shaped and may substantially maintain (e.g., hold) the shape without returning back (e.g., springing back) to a previous shape (e.g., may be plastically deformed). For example, the conductive material may be molybdenum, stainless steel, copper, etc. The conductive material of the carrier 300 may also exhibit a high thermal conductivity to achieve improved cooling of the assemblies including the carrier 300. The insulative materials may be flexible materials, which may deform without breaking. In some embodiments, one or more of the insulative materials may be in a liquid state during processing. In other embodiments, the insulative materials may be a flexible solid material, such as a polymer (e.g., polyethylene terephthalate, polyimide, polyethylene naphthalate, etc.).

The carrier 300 may be bent or folded at a location between a connection region 304 and a routing region 306 of the carrier 300. For example, the carrier 300 may be bent in a bending or folding tool, such as a brake. The bent carrier 300 may form an angle 308 between the routing region 306 and the connection region 304. For example, the connection region 304 may remain in a plane extending along the Y-axis and the routing region 306 may be bent into a plane transverse to the plane of the connection region. The angle 308 may be in a range from about 60° to about 120°, such as about 90° (e.g., in a plane extending along the X-axis). The conductive material of a substrate 302 may maintain the bent shape, such that the substrate 302 may remain in substantially the same bent shape after the carrier 300 is removed from the bending or folding tool. The bent or folded portion of the carrier 300 may reduce a surface area of the carrier 300 in a plane of the connection region 304. As illustrated in FIG. 3, the routing region 306 may be on one side of the carrier 300 and the opposite side of the carrier may remain substantially flat. In other embodiments, the carrier 300 may include routing regions 306 on more than one side of the carrier 300.

The routing region 306 may extend away from the connection region 304. The routing region 306 may extend a distance 313 away from the connection region 304. The distance 313 may be similar to the width 108 (FIG. 1) of the routing region 106 (FIG. 1) described above. For example, the distance 313 may be in the range from about 1 mm to about 1.5 mm, such as from about 1 mm to about 1.3 mm, or about 1.1 mm. In some embodiments, the distance 313 may be between about 1/14 (7%) of a width 314 of the connection region 304 and about 1/10 (10%) of the width 314 of the connection region 304, such as about 1/12 (8%) of the width of the connection region 304. The distance 313 may be less than a total height of a stack of microelectronic devices that may be assembled over the connection region 304 of the carrier 300.

The connection region 304 may include a device connecting surface 310 and a package connecting surface 312. The device connecting surface 310 may be configured to receive microelectronic devices, such as semiconductor dice. The device connecting surface 310 may include an array of connections, such as solder balls, conductive pads, conductive pins, etc., configured to receive matching or complementary connections of a microelectronic device as described in further detail with respect to FIG. 4. While not illustrated in the perspective of FIGS. 3 and 4, the carrier 300 includes a pattern of connections 104 as described above for FIG. 1. A portion of the pattern of the connections 104 may be configured to be substantially the same as corresponding patterns of connections on a microelectronic device 402.

The package connecting surface 312 may be configured to couple the carrier 300 to another microelectronic device or electronic device. For example, the package connecting surface 312 may be configured to couple the carrier 300 to a printed circuit board, such as a circuit board, mother board, etc., of a larger electronic device. The package connecting surface 312 may include connections configured to match or to be complementary to connections on the other microelectronic device or electronic device. As described above, the folded or bent routing region 306 of the carrier 300 may reduce a surface area of the carrier 300 in the plane of the connection region 304. This may reduce the surface area requirements of an associated connection region of the other microelectronic device or electronic device to which the carrier 300 is attached.

Figure 4:
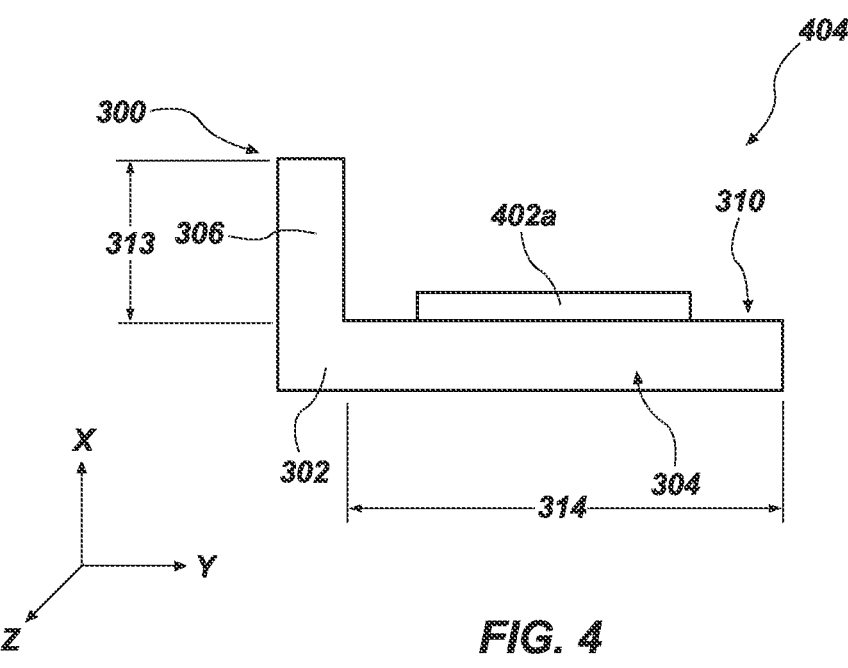
FIG. 4 illustrates a schematic view of a carrier and a microelectronic device during a processing act in accordance with embodiments of the disclosure.

Referring next to FIG. 4, a microelectronic device 402a may be coupled to the connection region 304 of the carrier 300. As described above, the connection region 304 may include a device connecting surface 310 with connections, such as connections 104 (FIG. 1), which may be configured to couple the microelectronic device 402a to the substrate 302 in the connection region 304. The connections may secure the microelectronic device 402a to the substrate 302. For example, the connections may be solder balls, which may be melted in a reflow process to secure the microelectronic device 402a to the surface of the substrate 302 of the carrier 300. The connections may also form an electrical connection between the microelectronic device 402a and components of the carrier 300, such as routing structures, circuit components, etc.

Figure 5:
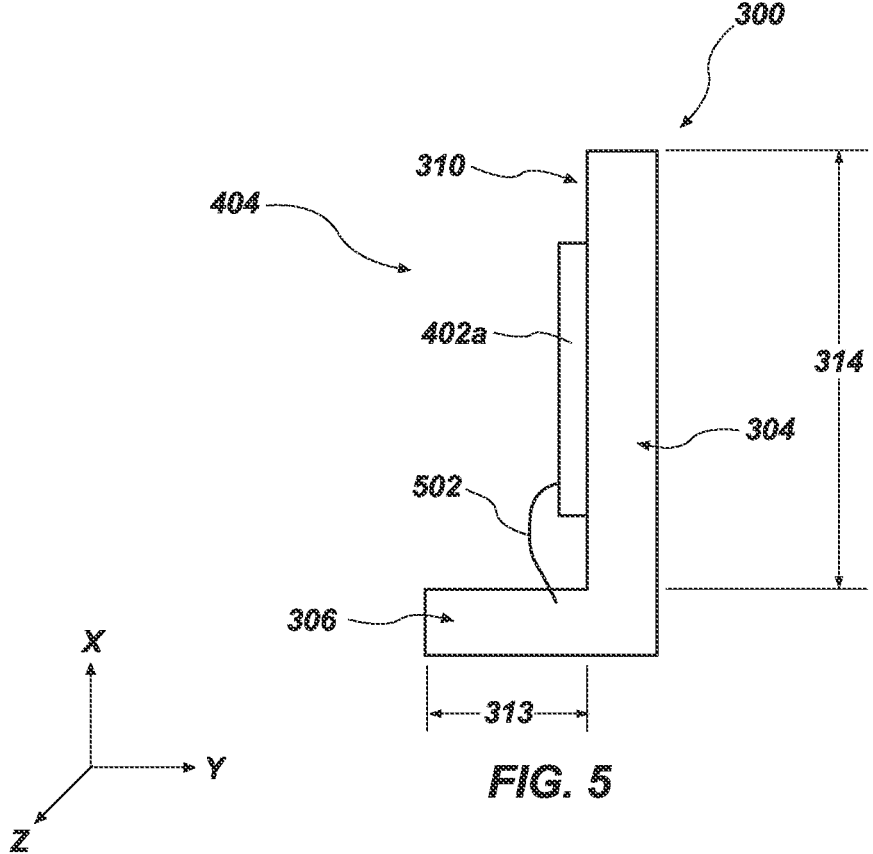
FIG. 5 illustrates a schematic view of a carrier and a microelectronic device during a processing act in accordance with embodiments of the disclosure.

Referring next to FIG. 5, the microelectronic device 402a may be coupled to the routing region 306 through a wire bond 502. The wire bond 502 may be configured to provide an electrical connection between the microelectronic device 402a and the routing region 306 of the carrier 300. In some embodiments, the wire bond 502 may be coupled to the microelectronic device 402a and/or the routing region 306 through a reverse bonding process, which may be configured to maintain a wire angle of less than about 55°. Furthermore, a reverse bonding process may reduce a length of the associated wire bonds 502.

The wire bond 502 may first be coupled to the microelectronic device 402a with an assembly 404 including the carrier and microelectronic device 402a in a lateral position, as illustrated in FIG. 4, such that the plane of the connection region 304 and the microelectronic device 402a is positioned transverse (e.g., perpendicular) to the tooling configured to attach the wire bond 502. After the wire bond 502 is attached to the microelectronic device 402a, the assembly 404 including the carrier 300 and the microelectronic device 402a may be rotated to position the routing region 306 in a plane transverse to the tooling configured to attach the wire bond 502.

For example, the tooling configured to attach the wire bond 502 may be configured to descend in a vertical direction to attach the wire bond 502 to a microelectronic device positioned in a horizontal plane. Thus, the assembly including the carrier 300 and the microelectronic device 402a may first be positioned with the connection region 304 extending in the horizontal plane (see FIG. 4), such that the tooling may descend in the vertical direction to attach the wire bond 502 to the microelectronic device 402a. The assembly may then be rotated until the routing region 306 extends in the horizontal plane (see FIG. 5), such that the tooling may descend in the vertical direction to attach the wire bond 502 to the routing region 306 of the carrier 300. Rotating the assembly may facilitate using conventional wire bond tooling to attach the wire bond 502 to both the microelectronic device 402a and the routing region 306 of the carrier 300, with the routing region 306 being positioned at the angle 308 relative to the connection region 304 of the carrier 300.

Figure 6:
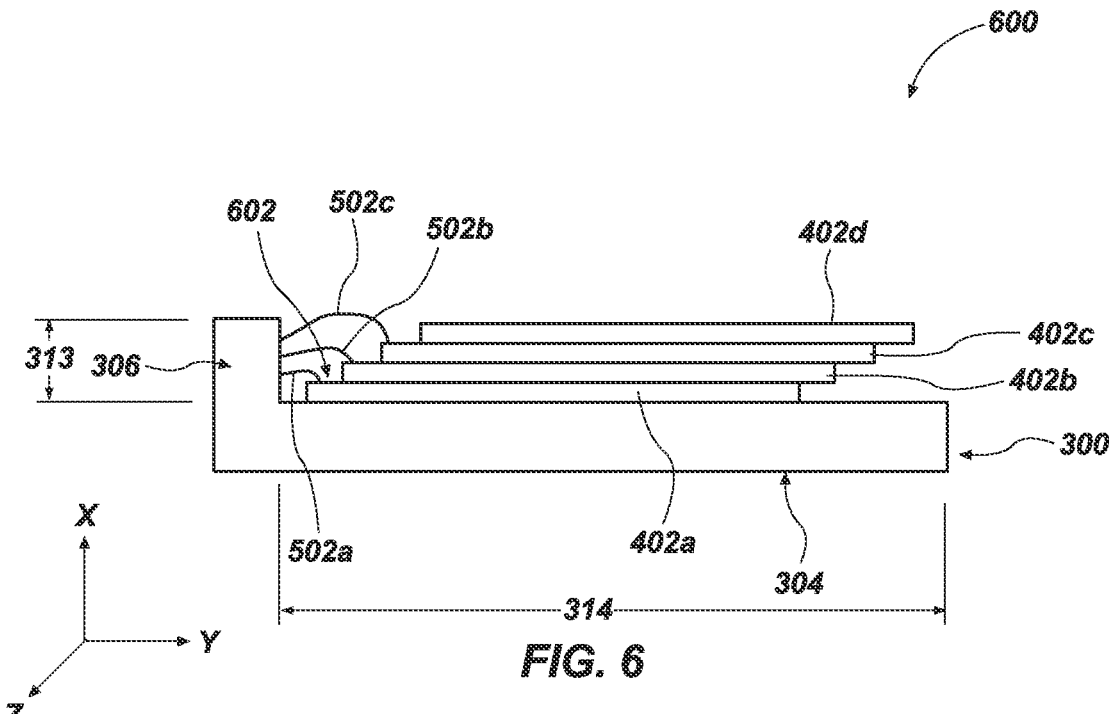
FIG. 6 illustrates a schematic view of a microelectronic device package after the processing acts illustrated in FIGS. 3-5 in accordance with embodiments of the disclosure.

Referring next to FIG. 6, multiple additional microelectronic devices 402b-402d may be positioned adjacent to the first microelectronic device 402a to form a microelectronic device package 600 including the multiple stacked microelectronic devices 402. Each of the microelectronic devices 402b-402d may be offset from the adjacent microelectronic devices 402, such that a wire bonding region 602 of the lower microelectronic devices 402 remains accessible and such that an associated wire bond 502a-502c only contacts one microelectronic device 402 of the multiple microelectronic devices 402a-402d.

For example, the first microelectronic device 402a positioned directly on the device connecting surface 310 of the carrier 300 may be coupled to the routing region 306 through a first wire bond 502a. The first wire bond 502a may include multiple wire bonds 502a at different positions along the first microelectronic device 402a in a direction into and/or out of the plane of the drawing (e.g., in a direction along the Z-axis). A second microelectronic device 402b may be positioned adjacent to a top surface of the first microelectronic device 402a. The second microelectronic device 402b may be coupled to the first microelectronic device 402a, such as through direct chip attachments, solder balls, pins, etc. The second microelectronic device 402b may also be coupled to the carrier 300 through the first microelectronic device 402a. The second microelectronic device 402b may be positioned in an offset position relative to the first microelectronic device 402a, such that the wire bonding region 602 of the first microelectronic device 402a is not occupied (e.g., covered) by the second microelectronic device 402b. The first wire bond 502a may be connected to the first microelectronic device 402a in the wire bonding region 602. Thus, the second microelectronic device 402b being positioned in an offset position relative to the first microelectronic device 402a may facilitate the first wire bond 502a being coupled to the first microelectronic device 402a without contacting the second microelectronic device 402b.

The wire bonds 502a-502c may extend from each of the microelectronic devices 402 to the substrate 302. In some embodiments, a top microelectronic device 402d may not include (e.g., may lack) a wire bond 502 extending between the top microelectronic device 402d and the routing region 306. For example, in some embodiments, the top microelectronic device 402d may instead include a wire bond extending between the top microelectronic device 402d and an adjacent microelectronic device 402. In the embodiment illustrated in FIG. 6, the microelectronic device package 600 includes a stack of four microelectronic devices 402a-402d. However, the number of microelectronic devices 402 present in the microelectronic device package 600 may be more or less than four. The first microelectronic device 402a, second microelectronic device 402b, and third microelectronic device 402c each include one or more wire bonds 502a, 502b, and 502c extending between the associated microelectronic device 402a, 402b, 402c and the routing region 306. The presence of the folded up routing region 306 may substantially reduce a length of the wire bonds 502a, 502b, 502c used to connect the microelectronic devices 402a, 402b, 402c to the routing region 306. The reduction in length may be greater for the wire bonds 502 between the microelectronic devices 402 positioned higher in the stack and the routing region 306. For example, in a conventional microelectronic device package having a substantially flat carrier, the upper wire bonds would extend both the lateral distance from the upper microelectronic device to the routing region and the vertical distance from the upper microelectronic device and the routing region. Bending or folding the carrier 300 according to embodiments of the disclosure to position the routing region 306 at an angle relative to the connection region 304 may substantially eliminate the vertical distance between the upper microelectronic devices 402c, 402d and the routing region 306 and may reduce a lateral distance between the upper microelectronic devices 402c, 402d and the routing region 306.

Figure 7:
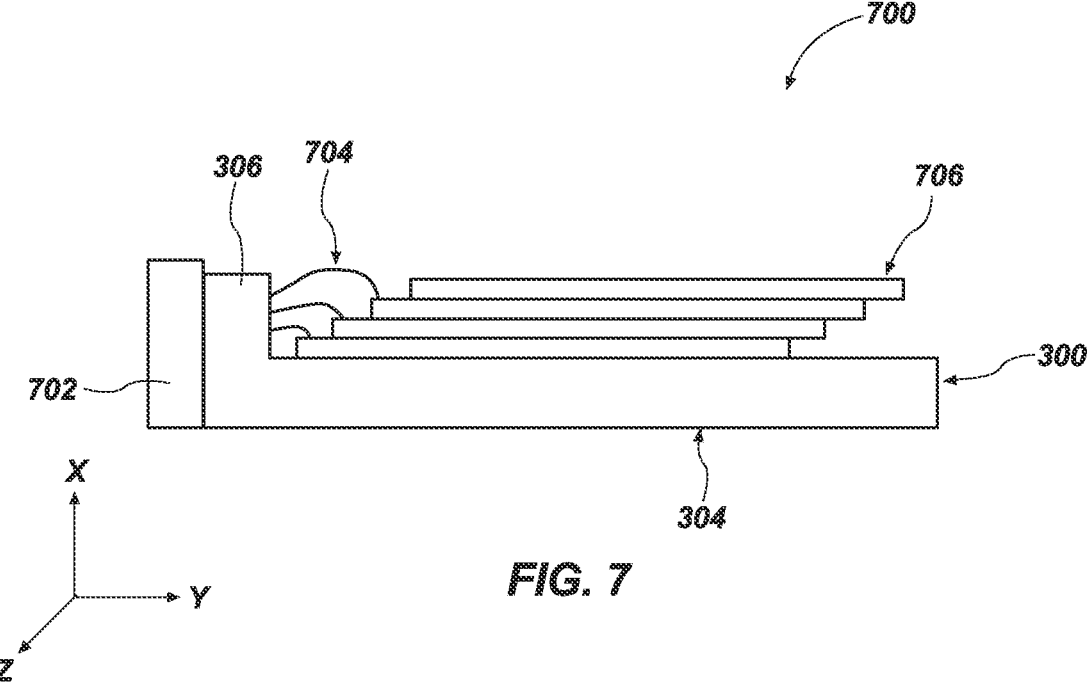
FIG. 7 illustrates a schematic view of a microelectronic device package in accordance with embodiments of the disclosure.

FIG. 7 illustrates a schematic view of another embodiment of a microelectronic device package 700. Similar to the microelectronic device package 600 of FIG. 6, the microelectronic device package 700 may include a microelectronic device stack 706 positioned adjacent to a connection region 304 of a carrier 300. The individual microelectronic devices of the microelectronic device stack 706 may be coupled to a routing region 306 of the carrier 300 through multiple wire bonds 704. The routing region 306 may be bent or folded relative to the connection region 304 of the carrier 300, which may reduce a wire length of the wire bonds 704. After the routing region 306 is bent relative to the connection region 304, a support structure 702 may be formed against an opposite side of the routing region 306 from the microelectronic device stack 706. The support structure 702 may be configured to substantially prevent the bent or folded portion of the carrier 300 from returning to a flat orientation. Thus, the support structure 702 may substantially support the routing region 306, which may substantially prevent movement of the routing region 306 during subsequent processing or use of the microelectronic device package 700. Maintaining the routing region 306 substantially stationary relative to the microelectronic device stack 706 may facilitate reliable connections between the microelectronic device stack 706 and the routing region 306 through the wire bonds 704. The support structure 702 may be formed from an electrically insulative material that is substantially rigid.

In some embodiments, the support structure 702 may facilitate the removal of heat from the carrier 300 and the associated microelectronic device package 700. For example, the support structure 702 may be formed from an electrically insulative material that has a high thermal conductivity. The support structure 702 may act as a heat sink and/or may transfer heat from the carrier 300 to a larger heat sink. For example, the support structure 702 may be formed from a composite material including thermally conductive filler materials, such as aluminum oxide, magnesium oxide, aluminum nitride, boron nitride, and diamond powder, etc.

Figure 8:
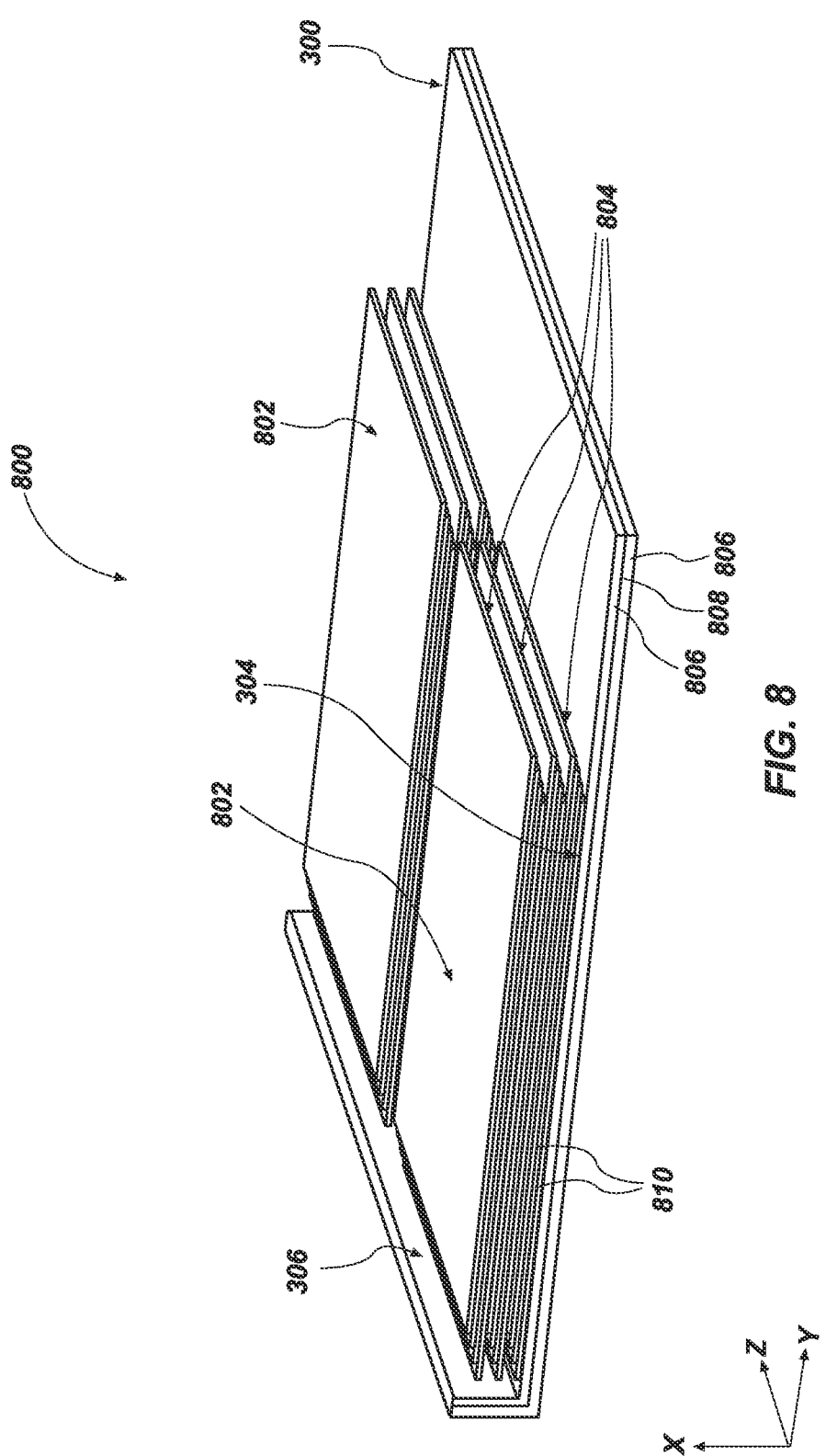
FIG. 8 illustrates a perspective view of a microelectronic device package in accordance with embodiments of the disclosure.

FIG. 8 illustrates a perspective view of an embodiment of a microelectronic device package 800. Similar to the microelectronic device packages 600, 700 described above, the microelectronic device package 800 may include one or more microelectronic device stacks 802 positioned adjacent to a carrier 300. The routing region 306 of the carrier 300 may be folded or bent relative to the connection region 304, as described above. As illustrated in FIG. 8, the microelectronic device stacks 802 may include multiple microelectronic device sub-stacks 804a-804c. Each of the microelectronic device sub-stacks 804a-804c may include multiple microelectronic devices 810, such as from two microelectronic devices 810 to twelve microelectronic devices 810, or from two microelectronic devices 810 to eight microelectronic devices 810, or from three microelectronic devices 810 to six microelectronic devices 810. The microelectronic device sub-stacks 804a-804c will be described in further detail below with respect to FIG. 9.

The carrier 300 may include multiple materials. For example, the carrier 300 may include a conductive material 806 and an insulative material 808. The insulative material 808 may be positioned between two material structures of the conductive material 806. The conductive material 806 may be positioned on a side of the carrier 300 adjacent to the microelectronic device stacks 802, such that the microelectronic devices 810 of the microelectronic device stacks 802 may be directly coupled to the conductive material 806 in one or more locations through direct chip attachments or through wire bonds, such as the wire bonds 502, 704 described above. At least one material structure of the conductive material 806 may be formed from a malleable material, such as molybdenum, stainless steel, copper, etc. The insulative material 808 may be a flexible material, which may deform without breaking. In some embodiments, insulative material 808 may be in a liquid state during processing. In other embodiments, the insulative material 808 may be a flexible solid material, such as a polymer (e.g., polyethylene terephthalate, polyimide, polyethylene naphthalate, etc.). In some embodiments, the carrier 300 may include additional alternating material structures of conductive material and insulative material. For example, the number of material structures in the carrier 300 may be in a range from three material structures to twenty-five material structures, such as from three material structures to nineteen material structures or from three material structures to fifteen material structures. The material structures may alternate between conductive materials 806 and insulative materials 808. In some embodiments, internal vias formed through the material structures of insulative materials 808 may form electrical connections between the different material structures of conductive materials 806.

Figure 9:
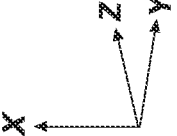
FIG. 9 illustrates an enlarged view of the microelectronic device package illustrated in FIG. 8.

FIG. 9 illustrates an enlarged view of a portion of the microelectronic device package 800. As illustrated, the microelectronic device package 800 may include multiple microelectronic device sub-stacks 804a-804c forming a microelectronic device stack 802. The routing region 306 being included on the folded or bent portion of the carrier 300 may facilitate increasing a height of the microelectronic device stack 802 either by including a greater number of microelectronic device sub-stacks 804a-804c or by including a greater number of microelectronic devices 810 in the microelectronic device sub-stacks 804a-804c. The number of microelectronic device sub-stacks 804a-804c in the microelectronic device stack 802 may be in a range from one microelectronic device sub-stack 804a to ten microelectronic device sub-stacks 804a-804c, such as from one microelectronic device sub-stack 804a to five microelectronic device sub-stacks 804a-804c.

Each of the microelectronic device sub-stacks 804a-804c may include a first microelectronic device 810A positioned at a bottom of the microelectronic device sub-stack 804a and a second microelectronic device 810C positioned at a top of the microelectronic device sub-stack 804a. The microelectronic device sub-stack 804a may further include one or more intermediary microelectronic devices 810B positioned between the first microelectronic device 810A and the second microelectronic device 810C.

Each of the first microelectronic device 810A and the intermediary microelectronic devices 810B may be coupled to the routing region 306 of the carrier 300 through wire bonds 902. The second microelectronic device 810C may be coupled to an adjacent microelectronic device 810A, 810B through a top wire bond 904. As illustrated in FIG. 9, the wire bonds 902 extending from the first microelectronic device 810A may have a length less than the wire bonds 902 extending from the second microelectronic device 810C and the intermediary microelectronic devices 810B. The difference in lengths of the wire bonds 902 may be due to the offset mounting pattern of the microelectronic devices 810 in each microelectronic device sub-stack 804. The distance between each of the microelectronic devices 810 and the routing region 306 may increase by the size of the offset created to maintain a clear (e.g., unoccupied) wire bonding region 910 on each microelectronic device 810. A second microelectronic device sub-stack 804b positioned adjacent to a first microelectronic device sub-stack 804a may begin with a first microelectronic device 810A positioned similarly to the first microelectronic device 810A in the first microelectronic device sub-stack 804a, such that the first microelectronic devices 810A in each of the microelectronic device sub-stacks 804a-804c may be substantially the same distance from the routing region 306 of the carrier 300. Thus, the length of the wire bonds 902 between the first microelectronic device 810A of each of the microelectronic device sub-stacks 804a-804c may be substantially the same length. Similarly, the length of the wire bonds 902 between each of the intermediary microelectronic device 810B and the routing region 306 may be substantially the same as similarly positioned intermediary microelectronic devices 810 in other microelectronic device sub-stacks 804a-804c. Thus, multiple microelectronic device sub-stacks 804a-804c may be stacked to form the microelectronic device stack 802 without substantial increases in the length of the wire bonds 902 between individual microelectronic devices 810 and the routing region 306.

The routing region 306 may include connections 908 defined on a surface of the routing region 306. The connections 908 may be configured to receive the wire bonds 902. In some embodiments, different connections 908 may be configured to electrically route the connection to other electrical devices or connections in or on the carrier 300. In other embodiments, the connections 908 may be defined on a conductive material 806 of the carrier 300, such that the connections 908 may be coupled together such that the routing region 306 may act as common connection point for each of the microelectronic devices 810 in the microelectronic device stack 802, such as a power buss, signal ground, neutral bus, etc.

As described above, the carrier 300 may be formed from multiple alternating material structures of conductive materials 806 and insulative materials 808. In some embodiments, the multiple alternating material structures of conductive material 806 and insulative material 808 may be configured to route electrical signals, such as through vias and interconnects within the material structures of the carrier 300 similar to a printed circuit board. The carrier 300 may also include a dielectric core 906 formed from an insulative material, such as the insulative material 808. In some embodiments, the carrier 300 may include three material structures including the dielectric core 906 with a conductive material 806 on an upper and lower surface of the dielectric core 906. In other embodiments, as illustrated in FIG. 9, the carrier 300 may include multiple alternating material structures of conductive material 806 and insulative material 808. For example, the number of alternating material structures may be in a range from three material structures to twenty-five material structures, such as from three material structures to nineteen material structures or from three material structures to fifteen material structures. The dielectric core 906 may be the insulative material 808 in one or more of the central material structures of the multiple alternating material structures.

Thus, embodiments of the disclosure may include a microelectronic device package including a carrier including a connection region; and a routing region positioned at an angle relative to the connection region. The microelectronic device package may further include one or more microelectronic devices adjacent to the connection region of the carrier. The microelectronic device package may also include a wire bond coupled between at least one of the one or more microelectronic devices and the routing region of the carrier.

Another embodiment of the disclosure may include a method of forming a microelectronic device. The method may include forming a carrier. The method may further include bending a portion of the carrier including a routing region to an angle relative to a portion of the carrier including a connecting region. The method may also include coupling at least one microelectronic device to the connecting region of the carrier. The method may further include attaching a wire bond to a wire bonding region of the at least one microelectronic device. The method may also include attaching the wire bond to the routing region of the carrier.

Figure 10:
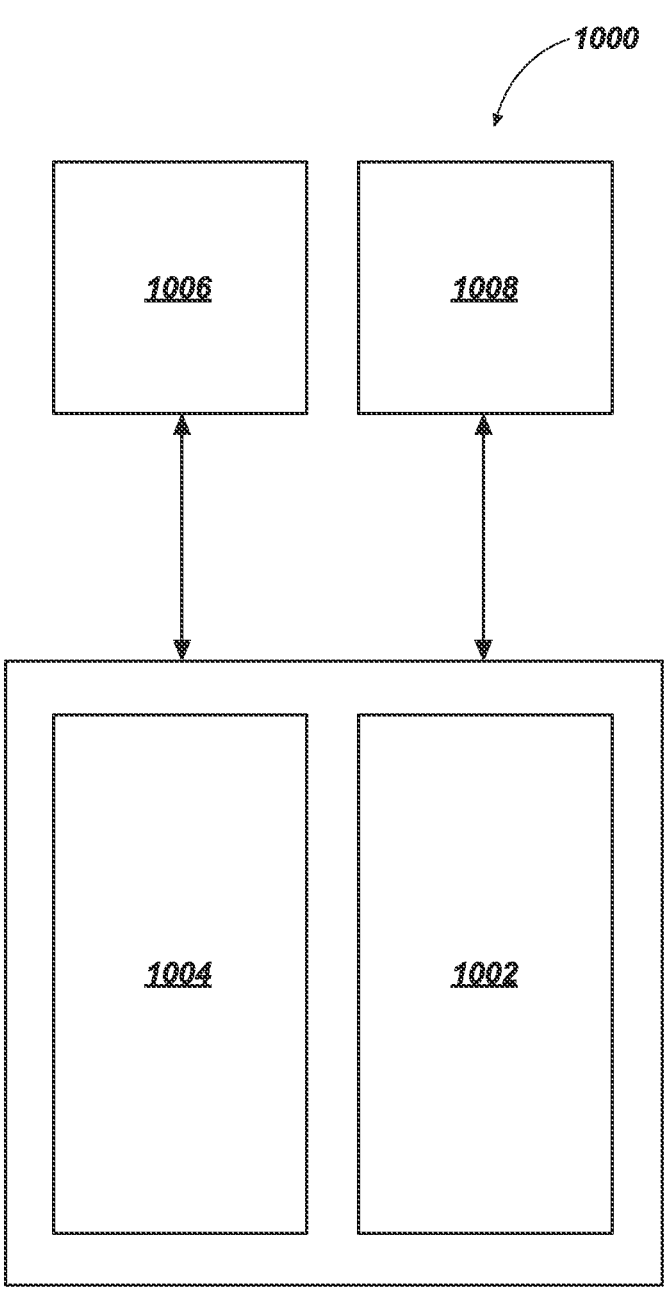
FIG. 10 is a schematic block diagram of an electronic system in accordance with one or more embodiments of the disclosure.

Microelectronic devices (e.g., the microelectronic device packages 600, 700, 800 including the stacked structures of the disclosure) may be included in embodiments of electronic systems of the disclosure. For example, FIG. 10 is a block diagram of an electronic system 1000, in accordance with embodiments of the disclosure. The electronic system 1000 may comprise, for example, a computer or computer hardware component, a server or other networking hardware component, a cellular telephone, a digital camera, a personal digital assistant (PDA), portable media (e.g., music) player, a Wi-Fi or cellular-enabled tablet such as, for example, an iPAD® or SURFACE® tablet, an electronic book, a navigation device, etc. The electronic system 1000 includes at least one memory device 1002. The memory device 1002 may include, for example, an embodiment of a microelectronic device package previously described herein (e.g., the microelectronic device packages 600, 700, 800 previously described with reference to FIGS. 6 through 9).

The electronic system 1000 may further include at least one electronic signal processor device 1004 (often referred to as a "microprocessor"). The electronic signal processor device 1004 may, optionally, include an embodiment of one or more of a microelectronic device package (e.g., the microelectronic device packages 600, 700, 800) previously described herein. The electronic system 1000 may further include one or more input devices 1006 for inputting information into the electronic system 1000 by a user, such as, for example, a mouse or other pointing device, a keyboard, a touchpad, a button, or a control panel. The electronic system 1000 may further include one or more output devices 1008 for outputting information (e.g., visual or audio output) to a user such as, for example, a monitor, a display, a printer, an audio output jack, a speaker, etc. In some embodiments, the input device 1006 and the output device 1008 may comprise a single touchscreen device that can be used both to input information to the electronic system 1000 and to output visual information to a user. The input device 1006 and the output device 1008 may communicate electrically with one or more of the memory device 1002 and the electronic signal processor device 1004.

Thus, embodiments of the disclosure may include a memory device. The memory device may include a carrier including a connection region and a routing region oriented at an angle in a range from about 45° to about 135° relative to the connection region. The memory device may further include at least one microelectronic device adjacent to the carrier. The memory device may also include a wire bond coupled between the at least one microelectronic device and the routing region of the carrier.

Another embodiment of the disclosure may include an electronic system. The electronic system may include an input device, an output device, a processor device operably coupled to the input device and the output device, and a memory device operably coupled to the processor device. The memory device may include a carrier including a malleable conductive material. The memory device may further include a stack of microelectronic devices positioned adjacent to the carrier. The stack of microelectronic devices including a first sub stack of microelectronic devices and a second sub stack of microelectronic devices. The first sub stack of microelectronic devices including a first microelectronic device and a second microelectronic device laterally offset from the first microelectronic device in a first direction and the second sub stack of microelectronic devices including a third microelectronic device and a fourth microelectronic device laterally offset from the third microelectronic device in the first direction. The first microelectronic device of the first sub stack of microelectronic devices is positioned in a same lateral position in the first direction as the third microelectronic device of each of the second sub stack of microelectronic devices.

Embodiments of the disclosure may reduce a length of the wire bonds coupling the individual microelectronic devices in a microelectronic device stack to a carrier. Reducing a length of the wire bonds may increase signal integrity and power integrity of the electricity traveling through the wire bonds. For example, reducing a length of the wire bonds may reduce power losses within the wire bonds. Reducing a length of the wire bonds may similarly reduce noise induced in the wire bonds by surrounding electrical fields. Reducing a length of the wire bonds may also facilitate maintaining acceptable wire overlap ratios for individual microelectronic devices higher in the microelectronic device stack. Acceptable wire overlap ratios may substantially prevent contact between different wire bonds, which may substantially prevent device failures due to shorts between wire bonds.

Embodiments of the disclosure may facilitate die stacks including an increased number of stacked dice. Increasing the number of dice in a die stack may increase the circuit density, which may increase a capacity, computing power, etc., of the resulting semiconductor device in the same footprint area or a smaller footprint area. Increasing the circuit density of the resulting semiconductor device may facilitate increased performance in an associated electronic system or device without increasing a size of the associated electronic system of device or while reducing a size of the associated electronic system or device. Similarly, bending or folding the routing region with respect to the connection region may reduce a footprint of the carrier, which may reduce the footprint of the resulting microelectronic device.

The embodiments of the disclosure described above and illustrated in the accompanying drawing figures do not limit the scope of the invention, since these embodiments are merely examples of embodiments of the invention, which is defined by the appended claims and their legal equivalents. Any equivalent embodiments are intended to be within the scope of this disclosure. Indeed, various modifications of the disclosure, in addition to those shown and described herein, such as alternative useful combinations of the elements described, may become apparent to those skilled in the art from the description. Such modifications and embodiments are also intended to fall within the scope of the appended claims and their legal equivalents.

What is claimed is:

1. A microelectronic device package including:
   a carrier comprising:
      a connection region; and
      a routing region positioned at an angle relative to the connection region;
   one or more microelectronic devices adjacent to the connection region of the carrier;
   a wire bond coupled between at least one of the one or more microelectronic devices and the routing region of the carrier; and
   a support structure positioned adjacent to the routing region on an opposite side of the routing region from the one or more microelectronic devices.

2. The microelectronic device package of claim 1, wherein the one or more microelectronic devices comprise at least two microelectronic devices arranged in a stack.

3. The microelectronic device package of claim 1, wherein the carrier comprises at least one malleable conductive material.

4. The microelectronic device package of claim 3, wherein the at least one malleable conductive material is selected from the group consisting of molybdenum, stainless steel, and copper.

5. The microelectronic device package of claim 1, wherein the carrier comprises at least three materials.

6. The microelectronic device package of claim 5, wherein the at least three materials comprise at least two conductive materials and an insulative material positioned between the at least two conductive materials.

7. The microelectronic device package of claim 1, wherein the angle between the routing region and the connection region is in a range from about 60° to about 120°.

8. The microelectronic device package of claim 1, the support structure comprising a thermally conductive material.

9. The microelectronic device package of claim 8, the thermally conductive material comprising a composite material including at least one thermally conductive filler material.

10. The microelectronic device package of claim 9, wherein the at least one thermally conductive filler material is selected from the group consisting of aluminum oxide, magnesium oxide, aluminum nitride, boron nitride, and diamond powder.

11. A method of forming a microelectronic device, the method comprising:
   forming a carrier;
   bending a portion of the carrier including a routing region to an angle in a range from about 45° to about 135° relative to a portion of the carrier including a connecting region;
   coupling at least one microelectronic device to the connecting region of the carrier;
   attaching a wire bond to a wire bonding region of the at least one microelectronic device; and
   attaching the wire bond to the routing region of the carrier.

12. The method of claim 11, further comprising rotating the microelectronic device after attaching the wire bond to the wire bonding region of the at least one microelectronic device and before attaching the wire bond to the routing region of the carrier.

13. The method of claim 12, wherein rotating the microelectronic device comprises rotating the microelectronic device from a first position where the at least one microelectronic device is in a plane transverse to a wire bonding tool to a second position where the routing region is in the plane transverse to the wire bonding tool.

14. The method of claim 11, wherein coupling the at least one microelectronic device to the connecting region of the carrier comprises coupling connections on a surface of the connecting region of the carrier to complementary connection features on the at least one microelectronic device.

15. The method of claim 14, wherein the connections include at least one of solder balls, conductive pads, conductive pins.

16. The method of claim 14, further comprising forming a support structure adjacent to the routing region, the support structure configured to support the routing region at the angle relative to the portion of the carrier including the connecting region.

17. A memory device comprising:
a carrier comprising:
a connection region; and
a routing region oriented at an angle in a range from about 45° to about 135° relative to the connection region;
at least one microelectronic device adjacent to the carrier; and
a wire bond coupled between the at least one microelectronic device and the routing region of the carrier.

18. The microelectronic device of claim 17, wherein the at least one microelectronic device comprises a stack of microelectronic devices including at least two sub stacks of microelectronic devices.

19. The microelectronic device of claim 18, wherein a first microelectronic device in a first sub stack of the at least two sub stacks of microelectronic devices is positioned in substantially a same distance from the routing region as a second microelectronic device in a second sub stack of the at least two sub stacks of microelectronic devices.

20. An electronic system, comprising:
an input device;
an output device;
a processor device operably coupled to the input device and the output device; and
a memory device operably coupled to the processor device and comprising:
a carrier including a malleable conductive material; and
a stack of microelectronic devices positioned adjacent to the carrier, the stack of microelectronic devices including a first sub stack of microelectronic devices and a second sub stack of microelectronic devices, the first sub stack of microelectronic devices including a first microelectronic device and a second microelectronic device laterally offset from the first microelectronic device in a first direction and the second sub stack of microelectronic devices including a third microelectronic device and a fourth microelectronic device laterally offset from the third microelectronic device in the first direction;
wherein the first microelectronic device of the first sub stack of microelectronic devices is positioned in a same lateral position in the first direction as the third microelectronic device of each of the second sub stack of microelectronic devices.

21. The electronic system of claim 20, wherein the first microelectronic device of the first sub stack of microelectronic devices is coupled to the carrier with a wire bond and the third microelectronic device of the second sub stack of microelectronic devices is coupled to the carrier with a second wire bond.

22. The electronic system of claim 21, wherein a first wire bond between the first microelectronic device and the carrier is substantially a same length as the second wire bond between the third microelectronic device and the carrier.

* * * * *